US012658551B2

(12) United States Patent
Zhang et al.

(10) Patent No.: US 12,658,551 B2
(45) Date of Patent: Jun. 16, 2026

(54) TERAHERTZ CARRIER SENDING AND RECEIVING APPARATUS INCLUDING A MODE CONVERSION STRUCTURE

(71) Applicant: Huawei Technologies Co., Ltd., Shenzhen (CN)

(72) Inventors: Luqi Zhang, Shenzhen (CN); Kun Li, Chengdu (CN); Rui Lyu, Chengdu (CN); Yu Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 363 days.

(21) Appl. No.: 18/344,251

(22) Filed: Jun. 29, 2023

(65) Prior Publication Data

US 2023/0352807 A1 Nov. 2, 2023

Related U.S. Application Data

(63) Continuation of application No. PCT/CN2021/140105, filed on Dec. 21, 2021.

(30) Foreign Application Priority Data

Dec. 31, 2020 (CN) .......................... 202011632320.0

(51) Int. Cl.
*H01P 5/08* (2006.01)
*H01P 5/02* (2006.01)
(Continued)

(52) U.S. Cl.
CPC .............. *H01P 5/087* (2013.01); *H01P 5/024* (2013.01); *H01P 5/08* (2013.01); *H05K 1/0246* (2013.01);
(Continued)

(58) Field of Classification Search
CPC .................................. H01P 5/087; H01P 5/024
(Continued)

(56) References Cited

U.S. PATENT DOCUMENTS

2006/0119450 A1* 6/2006 Kato et al. .............. H01P 5/107
333/26
2014/0333388 A1* 11/2014 Tamura ................... H01P 5/107
333/26
(Continued)

FOREIGN PATENT DOCUMENTS

CN 103022614 A 4/2013
CN 104425860 A 3/2015
(Continued)

*Primary Examiner* — Benny T Lee
(74) *Attorney, Agent, or Firm* — Conley Rose, P.C.

(57) ABSTRACT

A terahertz carrier sending apparatus and a terahertz carrier receiving apparatus include a feed transmission line configured to receive an electrical signal sent by a radio frequency sending circuit. A mode excitation structure is configured to excite a terahertz signal. A mode conversion structure includes an inner cavity whose inner wall is metal. The feed transmission line and the mode excitation structure are fastened to a circuit board. The mode conversion structure further includes a positioning slot. A part of the circuit board and the mode excitation structure are inserted into the inner cavity of the mode conversion structure. A plurality of metal through holes are distributed on both a first side and a second side of the mode excitation structure. A boundary of the positioning slot is metal and press-fitted on the metal through holes on both the first side and the second side.

20 Claims, 8 Drawing Sheets

(51) Int. Cl.
    *H05K 1/02*         (2006.01)
    *H10W 44/20*       (2026.01)

(52) U.S. Cl.
    CPC ............ *H05K 1/025* (2013.01); *H10W 44/20*
        (2026.01); *H05K 2201/10098* (2013.01);
        *H10W 44/216* (2026.01); *H10W 44/248*
        (2026.01)

(58) Field of Classification Search
    USPC ................................................... 333/33, 248
    See application file for complete search history.

(56) References Cited

U.S. PATENT DOCUMENTS

| | | | |
|---|---|---|---|
| 2016/0036114 A1* | 2/2016 | Okada ....................... | H01P 3/16 |
| | | | 307/104 |
| 2018/0226708 A1 | 8/2018 | Li et al. | |
| 2019/0305409 A1* | 10/2019 | Rousstia et al. ......... | H01P 3/12 |

FOREIGN PATENT DOCUMENTS

| | | |
|---|---|---|
| CN | 107342446 A | 11/2017 |
| CN | 108258379 A | 7/2018 |

* cited by examiner

TERAHERTZ CARRIER SENDING AND RECEIVING APPARATUS INCLUDING A MODE CONVERSION STRUCTURE

CROSS-REFERENCE TO RELATED APPLICATIONS

This application is a continuation of International Patent Application No. PCT/CN2021/140105 filed on Dec. 21, 2021, which claims priority to Chinese Patent Application No. 202011632320.0 filed on Dec. 31, 2020. The disclosures of the aforementioned applications are hereby incorporated by reference in their entireties.

TECHNICAL FIELD

The present disclosure relates to the field of terahertz communication, and in particular, to a terahertz carrier sending apparatus and a terahertz carrier receiving apparatus.

BACKGROUND

With rapid growth of traffic in a network data center, a requirement for a transmission rate between devices in the data center is increasingly high, and a large quantity of high-speed cables are required for interconnection between cabinets in the data center and inside the cabinets. Currently, one connection mode is using a direct attach copper cable. However, as operating frequency increases, an increased metal loss greatly limits a transmission distance and a transmission rate of the copper cable. Another connection mode is using an active optical cable. However, because optical-to-electrical conversion is required for transmitting and receiving, power consumption and costs are greatly increased.

Currently, there is still another interconnection mode, that is, using a terahertz (THz) frequency band as a carrier, and using a terahertz transmission line as a transmission medium, to perform interconnection in the data center and another short-distance high-speed communication scenario. At an interface between the terahertz transmission line and a communication device, a terahertz signal in a radio frequency transceiver chip is usually guided into a resonant cavity of a metal connector through a microstrip, and an electromagnetic signal is coupled to the terahertz transmission line. This type of connector introduces a reflection resonance point. As a result, coupling efficiency and operating bandwidth are greatly reduced.

SUMMARY OF THE INVENTION

Embodiments of the present disclosure provide a terahertz carrier sending apparatus and a terahertz carrier receiving apparatus, to implement efficient electromagnetic coupling and improve data transmission bandwidth.

According to a first aspect, an embodiment of the present disclosure provides a terahertz carrier sending apparatus, including a feed transmission line, a mode excitation structure, a mode conversion structure, a terahertz transmission line, and a circuit board. The feed transmission line is configured to: receive an electrical signal sent by a radio frequency sending circuit, and transmit the electrical signal to the mode excitation structure. The mode excitation structure is configured to excite a terahertz signal based on the received electrical signal. The mode conversion structure includes an inner cavity having a metal inner wall, and the mode excitation structure and one end of the terahertz transmission line are located in the inner cavity, so that the terahertz signal excited by the mode excitation structure is coupled into the terahertz transmission line. The terahertz transmission line is configured to transmit the terahertz signal. The feed transmission line and the mode excitation structure are fastened to the PCB. The mode conversion structure further includes a positioning slot configured to insert a part of the circuit board and the mode excitation structure into the inner cavity of the mode conversion structure. A plurality of metal through holes are distributed on both a first mode excitation structure side and a second mode excitation structure side of the mode excitation structure. A boundary of the positioning slot is metal and press-fitted on the metal through holes on both the first mode excitation structure side and the second mode excitation structure side. In this way, efficient electromagnetic coupling is implemented, and data transmission bandwidth is improved.

In a possible design, the feed transmission line, the mode excitation structure, and the metal through hole are located on the circuit board. Therefore, coupling efficiency can be further improved.

In still another possible design, the feed transmission line, the mode excitation structure, and the metal through hole are located on a package substrate of a radio frequency sending chip, and a metal through hole part on the package substrate and a corresponding part of the circuit board are press-fitted by the boundary of the positioning slot. Therefore, coupling efficiency can be further improved.

In still another possible design, the feed transmission line, the mode excitation structure, and the metal through hole are located on a radio frequency sending chip, and a metal through hole part on the chip and a corresponding part of the circuit board are press-fitted by the boundary of the positioning slot. Therefore, coupling efficiency can be further improved.

In still another possible design, the radio frequency sending chip further includes an impedance matching structure configured to match impedance between the feed transmission line and the mode excitation structure. Therefore, coupling efficiency can be further improved.

In still another possible design, a plurality of metal through holes are distributed on both a first impedance matching structure side and a second impedance matching structure side of the impedance matching structure. Therefore, coupling efficiency can be further improved.

In still another possible design, the impedance matching structure includes a uniform substrate integrated waveguide and a tapered substrate integrated waveguide, and distances between metal through holes on both a first tapered substrate integrated waveguide side and a second tapered substrate integrated waveguide side of the tapered substrate integrated waveguide also gradually change accordingly. Therefore, coupling efficiency can be further improved.

In still another possible design, a radiation phase center of the mode excitation structure coincides with an axial direction of the mode conversion structure. Therefore, coupling efficiency can be further improved.

According to a second aspect, an embodiment of the present disclosure provides a terahertz carrier receiving apparatus, including a terahertz transmission line, a mode conversion structure, a mode excitation structure, a feed transmission line, and a circuit board. The terahertz transmission line is configured to receive a terahertz signal. The mode conversion structure includes an inner cavity having a metal inner wall, and the mode excitation structure and one end of the terahertz transmission line are located in the inner cavity, so that the terahertz signal in the terahertz transmission line is coupled into the mode excitation structure. The mode excitation structure is configured to: convert the terahertz signal into an electrical signal, and send the electrical signal to the feed transmission line. The feed transmission line is configured to transmit the electrical signal to a radio frequency receiving circuit. The feed transmission line and the mode excitation structure are fastened to the PCB. The mode conversion structure further includes a positioning slot configured to insert a part of the circuit board and the mode excitation structure into the inner cavity of the mode conversion structure. A plurality of metal through holes are distributed on both a first mode excitation structure side and a second mode excitation structure side of the mode excitation structure. A boundary of the positioning slot is metal and press-fitted on the metal through holes on both the first mode excitation structure side and the second mode excitation structure side. In this way, efficient electromagnetic coupling is implemented, and data transmission bandwidth is improved.

In still another possible design, the feed transmission line, the mode excitation structure, and the metal through hole are located on the circuit board. Therefore, coupling efficiency can be further improved.

In still another possible design, the feed transmission line, the mode excitation structure, and the metal through hole are located on a package substrate of a radio frequency receiving chip, and a metal through hole part on the package substrate and a corresponding part of the circuit board are press-fitted by the boundary of the positioning slot. Therefore, coupling efficiency can be further improved.

In still another possible design, the feed transmission line, the mode excitation structure, and the metal through hole are located on a radio frequency receiving chip, and a metal through hole part on the chip and a corresponding part of the circuit board are press-fitted by the boundary of the positioning slot. Therefore, coupling efficiency can be further improved.

In still another possible design, the radio frequency receiving chip further includes an impedance matching structure configured to match impedance between the feed transmission line and the mode excitation structure. Therefore, coupling efficiency can be further improved.

In still another possible design, a plurality of metal through holes are distributed on both a first impedance matching structure side and a second impedance matching structure side of the impedance matching structure. Therefore, coupling efficiency can be further improved.

In still another possible design, the impedance matching structure includes a uniform substrate integrated waveguide and a tapered substrate integrated waveguide, and distances between metal through holes on both a first tapered substrate integrated waveguide side and a second tapered substrate integrated waveguide side of the tapered substrate integrated waveguide also gradually change accordingly. Therefore, coupling efficiency can be further improved.

In still another possible design, a radiation phase center of the mode excitation structure coincides with an axial direction of the mode conversion structure. Therefore, coupling efficiency can be further improved.

DETAIL DESCRIPTION OF THE EMBODIMENTS

To make objectives, technical solutions, and advantages of the present disclosure clearer, the following further describes implementations of the present disclosure in detail with reference to accompanying drawings, where like features are denoted by the same reference labels throughout the detail description of the drawings.

Figure 1:
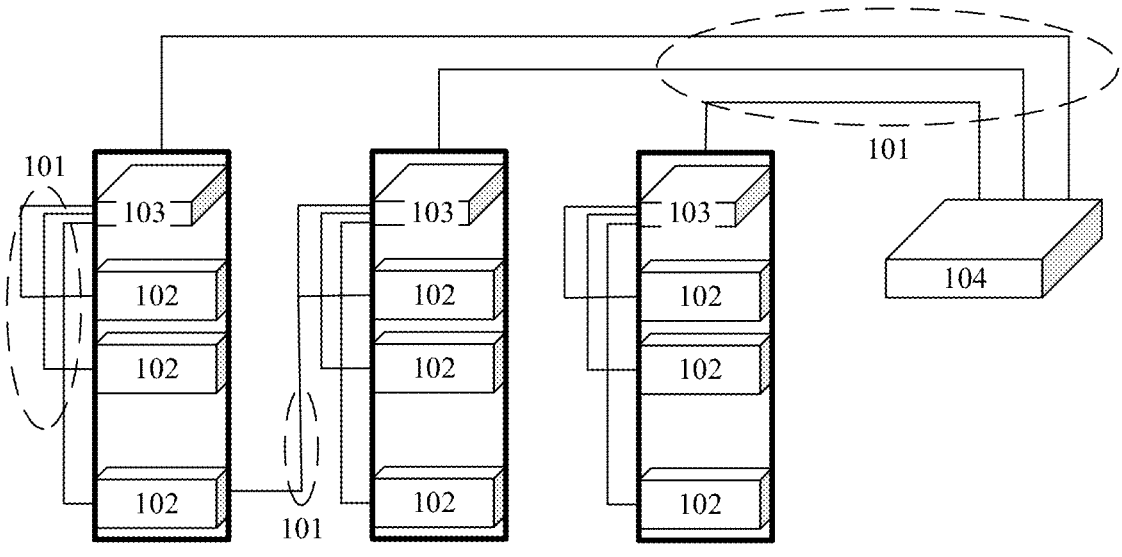
FIG. 1 is a schematic diagram of applying a terahertz cable to a data center according to an embodiment of the present disclosure.

A terahertz carrier sending apparatus and a terahertz carrier receiving apparatus provided in embodiments of the present disclosure may be used in a high-speed interconnection scenario, for example, a data center. As shown in FIG. 1, a terahertz carrier sending and receiving apparatus 101 (which may also be referred to as a "terahertz cable") may be used for data transmission between devices in the data center. For example, the terahertz carrier sending and receiving apparatus 101 may be used between each service device 102 in a cabinet and a cabinet top switch 103, between the service device 102 and a cabinet top switch 103 in another cabinet, or between the cabinet top switch 103 and a convergence LAN switch 104.

Figure 2:
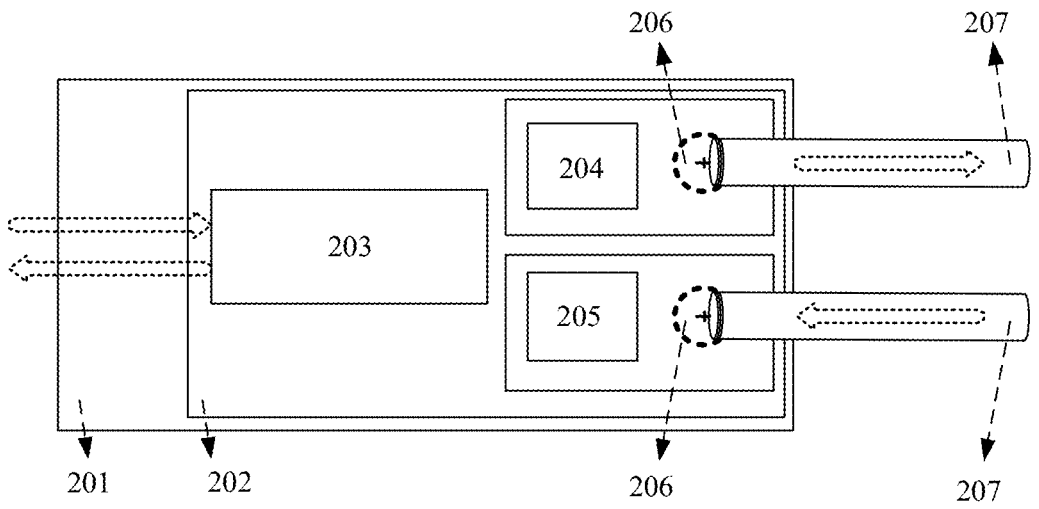
FIG. 2 is a schematic diagram of a structure of a terahertz carrier sending and receiving apparatus according to an embodiment of the present disclosure.

FIG. 2 is a schematic diagram of a structure of a terahertz carrier sending and receiving apparatus according to an embodiment of the present disclosure. The apparatus includes a housing packaging structure 201, and a PCB is packaged in the housing packaging structure. A baseband signal processing chip 203, a radio frequency sending chip 204, and a radio frequency receiving chip 205 are installed on the PCB. An electromagnetic coupling structure mode conversion structure 206 is further packaged in the housing packaging structure 201, and is connected to the radio frequency sending chip 204, the radio frequency receiving chip 205, and a terahertz transmission line 207.

When a message is sent, a to-be-sent service signal enters the radio frequency sending chip 204 after being processed by the baseband signal processing chip 203, and the electromagnetic coupling structure 206 is configured to couple, to the terahertz transmission line 207 for sending, a carrier signal output by the radio frequency sending chip 204. In addition, when a message is received, the electromagnetic coupling structure 206 couples, to the radio frequency receiving chip 205, a carrier signal received through the terahertz transmission line 207, and the baseband signal processing chip 203 processes the carrier signal to obtain a service signal. The electromagnetic coupling structure generally includes a feed transmission line, a mode excitation structure, and a mode conversion structure. A coupling structure may be implemented on a PCB, may be directly coupled on a chip, or may be coupled on a package structure of a chip.

The baseband signal processing chip 203, the radio frequency sending chip 204, and the radio frequency receiving chip 205 may also be packaged in a service device. Alternatively, the radio frequency sending chip 204 and the radio frequency receiving chip 205 may be integrated into one chip for implementation. Bidirectional transmission and reception may also be implemented by using one terahertz transmission line 207. To be specific, two different terahertz frequencies are used to carry terahertz signal transmission in two directions. In this case, one mode conversion structure 206 may be configured for bidirectional coupling, and may not only couple a to-be-sent carrier signal into a terahertz transmission line, but also couple a carrier signal received through the terahertz transmission line into a radio frequency receiving chip.

Figures 3, 4:
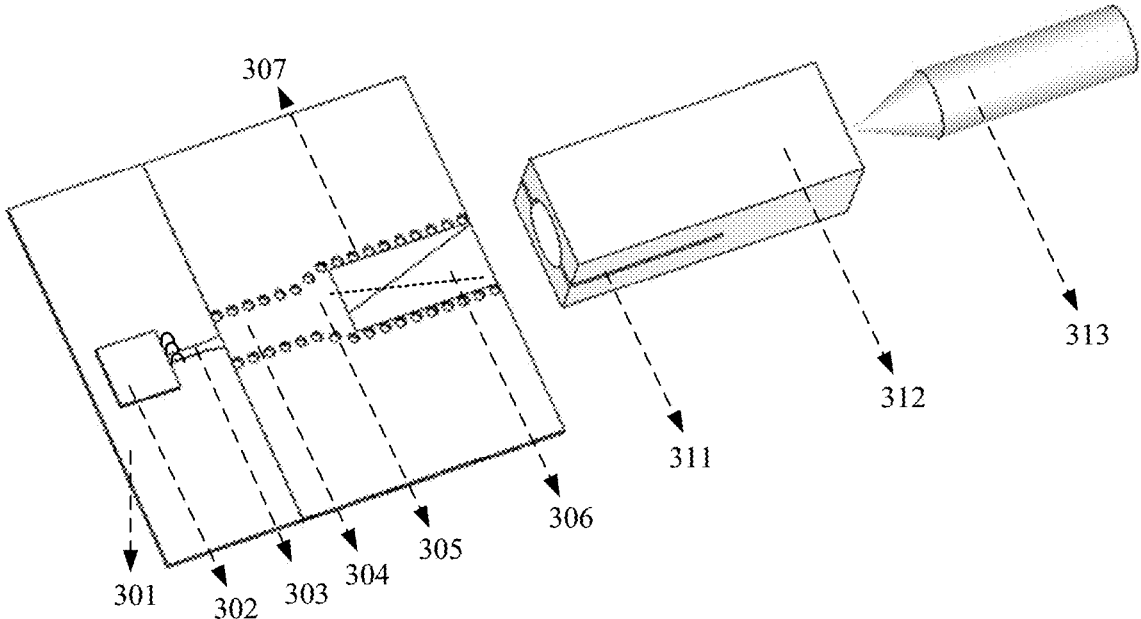
FIG. 3 is a schematic diagram of a three-dimensional structure of a terahertz carrier transceiver apparatus according to an embodiment of the present disclosure.
FIG. 4 is a schematic diagram of dimensions of a terahertz carrier transceiver apparatus according to an embodiment of the present disclosure.

FIG. 3 is a schematic diagram of a structure of a terahertz carrier transceiver apparatus according to an embodiment of the present disclosure. Both a feed transmission line and a mode excitation structure are packaged on a PCB 301, and an electromagnetic signal in a radio frequency transceiver chip is guided to the PCB in a chip packaging manner such as bonding or flip. The apparatus shown in FIG. 3 includes the following parts:

A carrier signal of a radio frequency sending chip 302 is fed into a uniform substrate integrated waveguide 304 through a feed microstrip 303 with a tapered structure, to convert from a quasi-TEM mode of a carrier signal in a plane feed microstrip structure to a quasi-TE10 mode of a carrier signal in the uniform substrate integrated waveguide. Further, the uniform substrate integrated waveguide 304 is connected to a tapered substrate integrated waveguide 305 for better impedance matching with a mode excitation structure 306. The mode excitation structure 306 in FIG. 3 is a forward and reverse linearly tapered slot end-fire antenna.

An inner cavity of a mode conversion structure 312 is cylindrical, an inner wall of the mode conversion structure 312 is metal, an eccentric position at one end of the mode conversion structure 312 is provided with a rectangular positioning slot 311, and the other end of the mode conversion structure 312 may be inserted into a terahertz transmission line 313. The PCB 301 is inserted into the positioning slot 311, so that a carrier signal sent by the end-fire antenna may be coupled into the terahertz transmission line 313 that is inserted into the inner cavity of the mode conversion structure 312.

Metal through holes 307 are arranged on both a first side and a second side of the substrate integrated waveguide 304/305 and the mode excitation structure 306. In this way, when the PCB is inserted into the positioning slot, a boundary of the positioning slot is press-fitted by the metal through holes. Because the boundary of the positioning slot 311 also uses a metal material, cavity leakage of an electromagnetic wave in the mode conversion structure 312 is reduced, and efficiency of coupling an electromagnetic signal from the end-fire antenna to the terahertz transmission line is improved. The tapered substrate integrated waveguide is used for feeding, to improve a broadband range of impedance matching.

Figure 8:
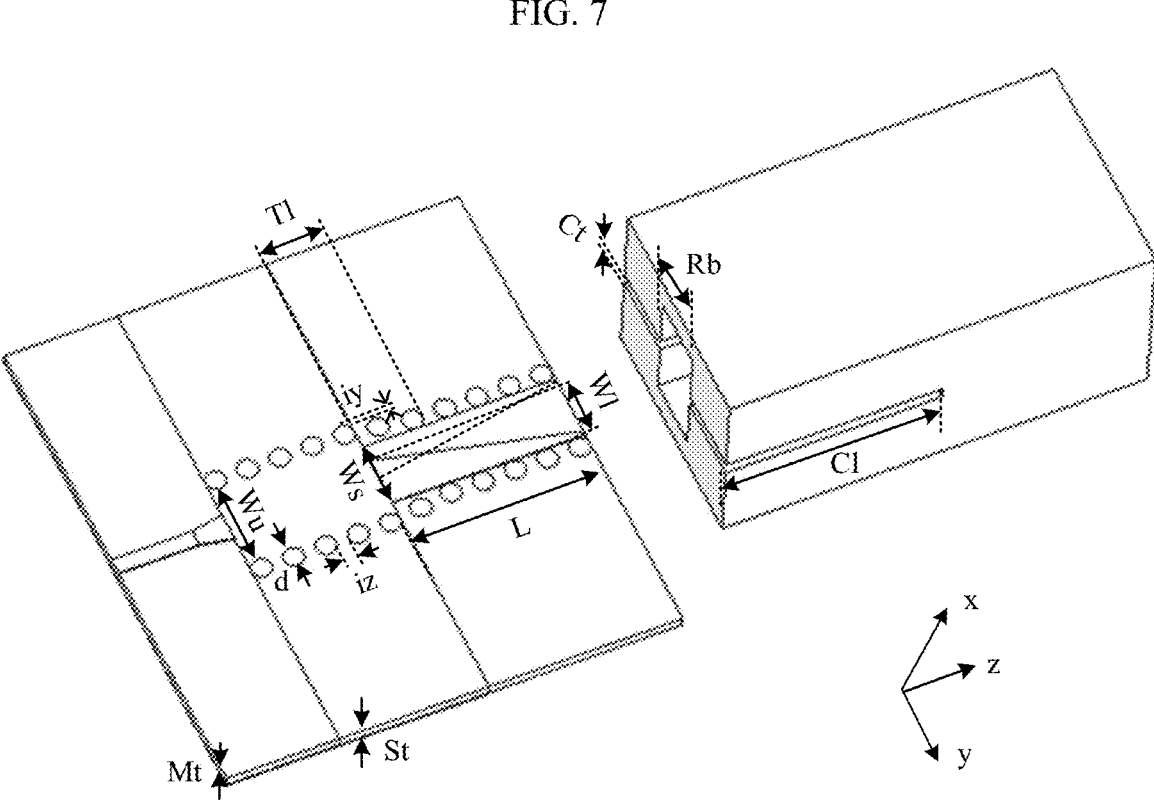
FIG. 8 is a schematic diagram of dimensions of another terahertz carrier transceiver apparatus according to an embodiment of the present disclosure.

Some related dimensions of a feed tapered section, the metal through hole, the positioning slot need to satisfy related conditions, to better implement carrier signal coupling. Refer to FIG. 4. A 3-dimensional coordinate system having three axes x, y, and z originating from a common origin is depicted in FIG. 4 and FIG. 8 to indicate that the drawing is 3-dimensional. The related dimensions and conditions to be satisfied are described below.

A feed tapered section of a tapered slot end-fire antenna needs to satisfy:

$$Ws = Wu + N \times iy, Tl = N \times (d + iz) \qquad \text{(Formula 1)}$$

Parameters in the formula 1 include a width Ws between through holes of a substrate integrated waveguide at a feed tapered section, a width Wu between through holes of the substrate integrated waveguide at a uniform section, a quantity N of metal through holes at the tapered section, a tapered distance iy of tapered metal through holes, a length Tl of the substrate integrated waveguide at the feed tapered section, a metal through hole diameter d, and a metal through hole spacing iz.

A tapered slot end-fire antenna and metal through holes on both a first tapered slot end-fire antenna side and a second tapered slot end-fire antenna side of the tapered slot end-fire antenna need to satisfy:

$$Wl \leq Ws, L = M \times (d + iz) \qquad \text{(Formula 2)}$$

Parameters in the formula 2 include a bottom patch width Wl of the forward and reverse linearly tapered slot antenna, a width Ws between through holes of the substrate integrated waveguide at the feed tapered section, a length L of the forward and reverse linearly tapered slot antenna, a quantity M of metal through holes arranged on both a first forward and reverse linearly tapered slot antenna side and a second forward and reverse linearly tapered slot antenna side of the forward and reverse linearly tapered slot antenna, a metal through hole diameter d, and a metal through hole spacing iz.

A position relationship between a metal mode converter and the PCB needs to satisfy:

$$Ct = St + 2 \times Mt, Cl \geq L \qquad \text{(Formula 3)}$$

Parameters in the formula 3 include a slot height Ct of the metal mode converter, a thickness St of a middle layer of the PCB, a thickness Mt between an upper metal layer and a lower metal layer of the PCB, a slot depth Cl of the metal mode converter, and a length L of the forward and reverse linearly tapered slot antenna.

According to embodiments of the present disclosure, leakage of an electromagnetic wave in the mode conversion structure is reduced, and efficiency of coupling an electromagnetic signal from the end-fire antenna to the terahertz transmission line is improved. For example, coupling efficiency may be learned from a diagram of electric field mode distribution of electromagnetic simulation. Specifically, simulation is performed based on embodiments shown in FIG. 3 and FIG. 4, and a solid core terahertz transmission line whose circular cross-sectional diameter is 1.65 millimeters (mm) and that is made from polytetrafluoroethylene is selected. Related dimensions include a diameter Cd=1.65 mm, a width Wu=1.00 mm between through holes of the substrate integrated waveguide at the uniform section, a width Ws=1.65 mm between through holes of the substrate integrated waveguide at the feed tapered section, a length Tl=0.80 mm of the substrate integrated waveguide at the feed tapered section, a metal through hole diameter d=0.25 mm, a metal through hole spacing iz=0.15 mm, a tapered distance iy=0.325 mm of tapered metal through holes, a length L=3.60 mm of a forward and reverse linearly tapered slot antenna, a bottom patch width Wl=1.18 mm of the forward and reverse linearly tapered slot antenna, a quantity N=2 of metal through holes at the tapered section, a quantity M=9 of metal through holes arranged on both the first forward and reverse linearly tapered slot antenna side and the second forward and reverse linearly tapered slot antenna side, a thickness St=0.127 mm of the middle layer of the PCB, a thickness Mt=0.018 mm between the upper metal layer and the lower metal layer of the PCB, a slot height Ct=0.163 mm of the metal mode converter, and a slot depth Cl=3.90 mm of the metal mode converter.

Figure 5:
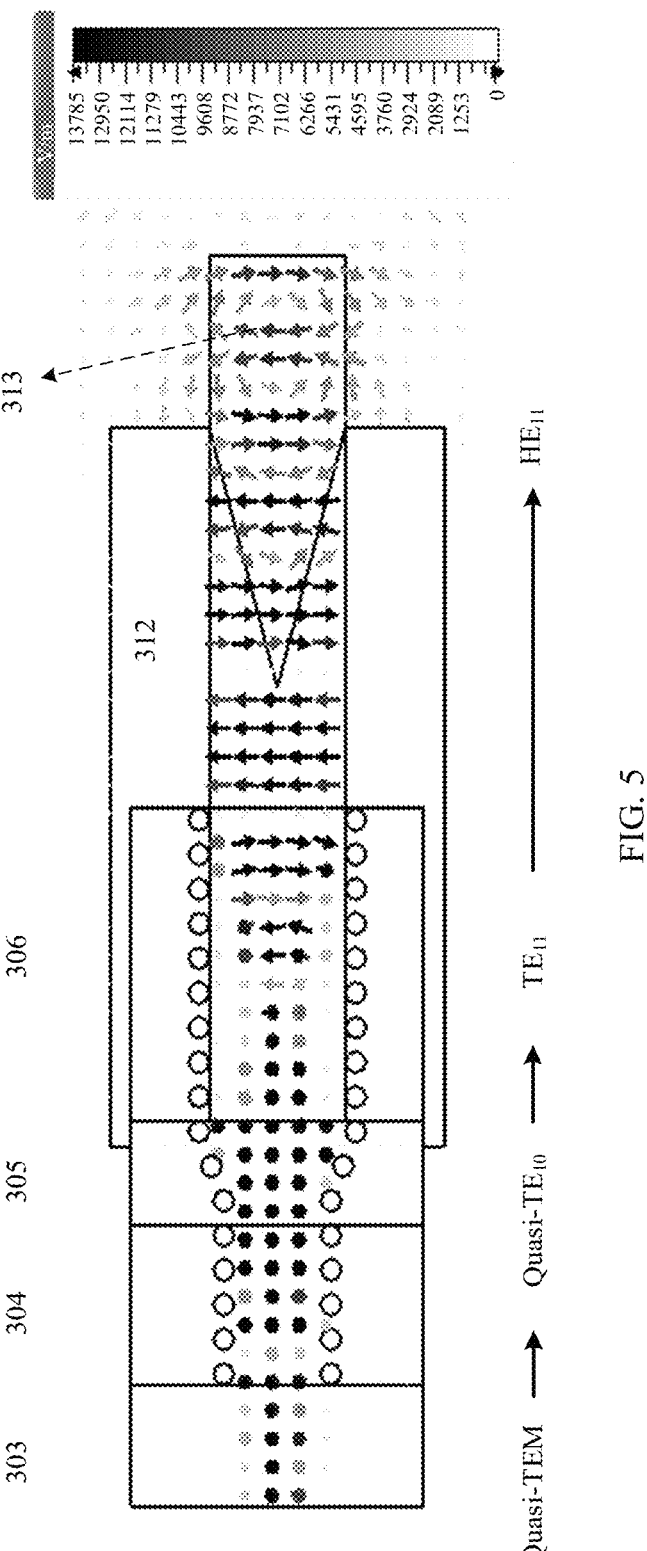
FIG. 5 is a schematic diagram of electric field mode distribution of electromagnetic simulation according to an embodiment of the present disclosure.

According to the foregoing related dimensions, a schematic diagram of electric field mode distribution shown in FIG. 5 may be obtained through electromagnetic simulation. An electromagnetic signal is connected from the microstrip 303 on the PCB to the on-chip substrate integrated waveguide 304, to convert from a quasi-TEM mode to a quasi-TE10 mode. Then, the electromagnetic signal feeds, through the substrate integrated waveguide 304 on the PCB, the forward and reverse linearly tapered slot mode excitation structure 306 comprising a forward and reverse linearly tapered slot mode excitation structure side and a second forward and reverse linearly tapered slot mode excitation structure side that are arranged with metal through holes, to excite a transmission fundamental mode TE11 mode in the circular metal mode conversion structure 312. Then, an electromagnetic wave is coupled into the solid core terahertz transmission line 313 with a tapered end face through the mode conversion structure 312, to implement fundamental mode transmission of an HE11 mode. From the electric field mode distribution, it may be understood that efficient mode field conversion of the electromagnetic signal from the radio frequency transceiver chip to the terahertz transmission line may be implemented by using the mode conversion structure on the PCB. The gradient color scale in FIG. 5 represents the electric-field strength measured in volts per meter (V/m). The darkest color on the top corresponds to the highest electric-field intensity, around 13785 V/m. The lightest color on the bottom corresponds to the lowest intensity, approaching 0 V/m.

Figure 6:
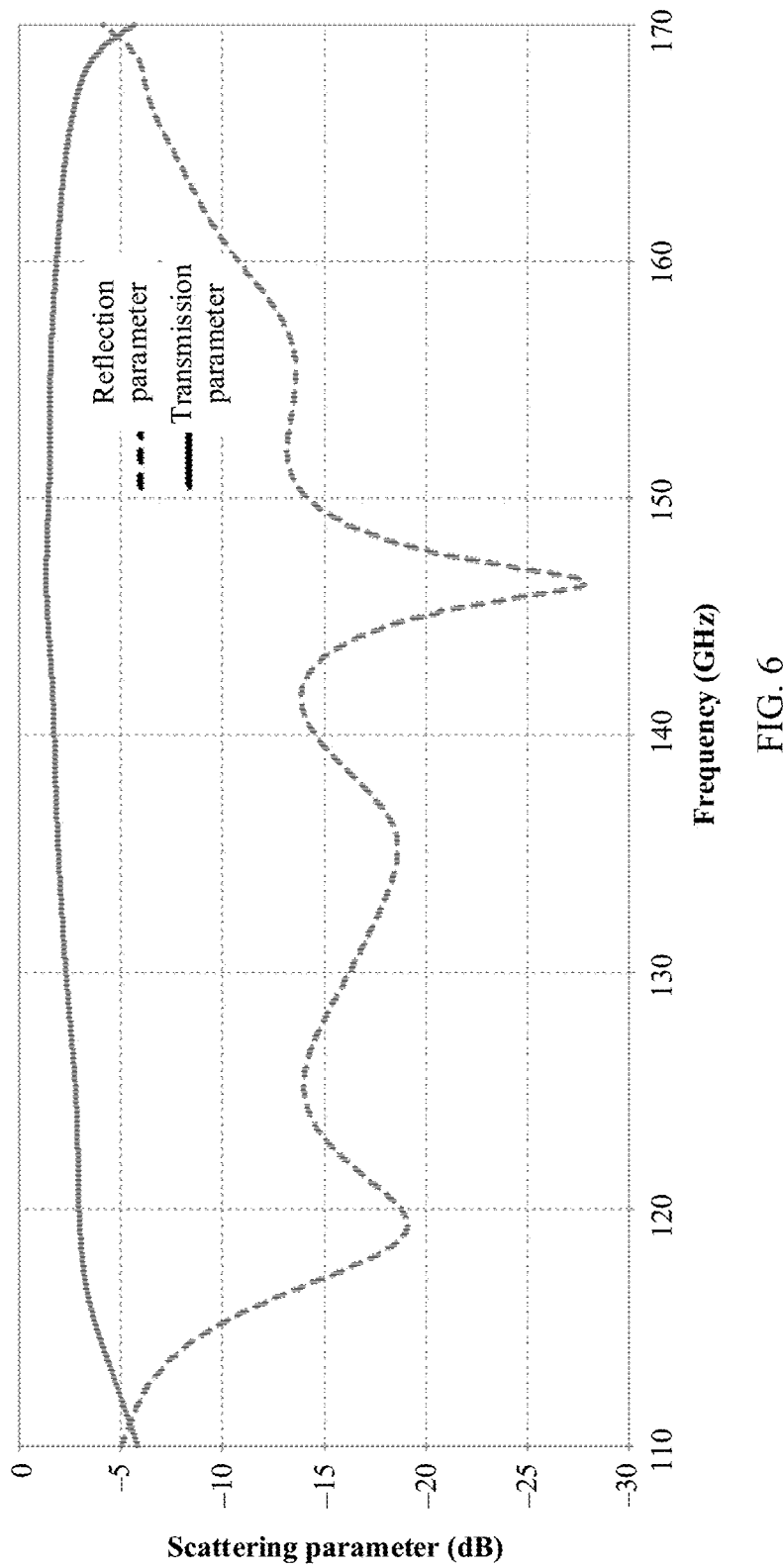
FIG. 6 is a schematic diagram of a transmission parameter of electromagnetic simulation according to an embodiment of the present disclosure.

As shown in the graph in FIG. 6, where the x-axis of the graph represents the Frequency in gigahertz (GHz) and the y-axis of the graph represents scattering parameters in decibels (dB), through electromagnetic simulation, it may be further understood that a transmission parameter from the feed microstrip on the PCB to the solid core terahertz transmission line is greater than −2.98 dB in a frequency range of 120 gigahertz GHz to 160 GHz, and a reflection parameter is less than −10.2 dB. This indicates that coupling efficiency is high in a very wide frequency band from the radio frequency transceiver chip to the terahertz transmission line. This helps improve a transmission distance and a communication rate of a system.

Figure 7:
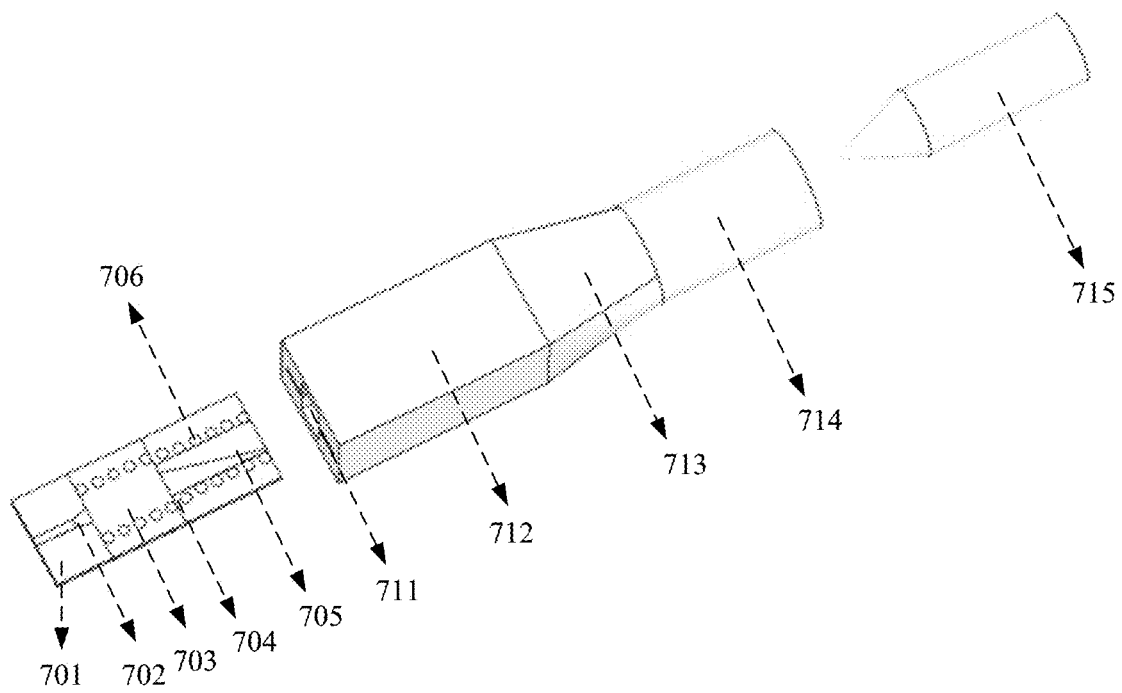
FIG. 7 is a schematic diagram of a three-dimensional structure of another terahertz carrier transceiver apparatus according to an embodiment of the present disclosure.

As shown in FIG. 7, an embodiment of the present disclosure further provides another terahertz carrier transceiver apparatus. In the figure, a mode conversion structure 712 has an inner cavity that has a rectangular cross section is used in the apparatus, and is connected to a cylindrical waveguide 714 through a segment of a square-circular conversion structure 713. Similarly, an electromagnetic signal in a radio frequency transceiver chip is guided to a PCB in a chip packaging manner such as bonding wire or flip chip. Specifically, the apparatus shown in FIG. 7 specifically includes the following several parts of structures.

A carrier signal of a radio frequency sending chip is fed into a uniform substrate integrated waveguide 703 through a feed microstrip 702 with a tapered structure, to convert from a quasi-TEM mode of a carrier signal in a plane feed microstrip structure to a quasi-TE10 mode of a carrier signal in the uniform substrate integrated waveguide. Further, the uniform substrate integrated waveguide 703 is connected to a tapered substrate integrated waveguide 704 for better impedance matching with a mode excitation structure 705. The mode excitation structure 705 in FIG. 7 is a forward and reverse linearly tapered slot end-fire antenna.

An inner cavity of a mode conversion structure 712 has a rectangular cross section, an inner wall of the mode conversion structure 712 is metal, an eccentric position at one end of the mode conversion structure 712 is provided with a rectangular positioning slot 711, and the other end of the mode conversion structure 712, that is, a cylindrical waveguide 714, may be inserted into a terahertz transmission line 715. A PCB 701 is inserted into the positioning slot 711, so that a carrier signal sent by the end-fire antenna may be coupled into the terahertz transmission line 715 that is inserted into the inner cavity of the mode conversion structure 712.

Metal through holes 706 are arranged on both a first side and a second side of the substrate integrated waveguide 703/704 and the mode excitation structure 705. In this way, when the PCB is inserted into the positioning slot, a boundary of the positioning slot is press-fitted by the metal through holes. Because the boundary of the positioning slot 711 also uses a metal material, cavity leakage of an electromagnetic wave in the mode conversion structure 712 is reduced, and efficiency of coupling an electromagnetic signal from the end-fire antenna to the terahertz transmission line is improved. The tapered substrate integrated waveguide is used for feeding, to improve a broadband range of impedance matching.

Similarly, some related dimensions of a feed tapered section, the metal through hole, and the positioning slot need to satisfy related conditions, to better implement carrier signal coupling. Refer to FIG. 8. The related dimensions and conditions to be satisfied are the same as those in the foregoing formula 1 to formula 3.

Similarly, embodiments shown in FIG. 7 and FIG. 8 may be simulated. Specifically, as shown in FIG. 8, the related dimensions include a width Wu=1.05 mm between through holes of the substrate integrated waveguide at the uniform section, a width Ws=0.83 mm between through holes of the substrate integrated waveguide at the feed tapered section, a length Tl=0.80 mm of the substrate integrated waveguide at the feed tapered section, a metal through hole diameter d=0.25 mm, a metal through hole spacing iz=0.15 mm, a tapered distance iy=0.055 mm of tapered metal through holes, a length L=2.40 mm of the forward and reverse linearly tapered slot antenna, a bottom patch width Wl=0.62 mm of the forward and reverse linearly tapered slot antenna, a quantity N=2 of metal through holes at the tapered section, a quantity M=4 of metal through holes that are evenly arranged on both the first forward and reverse linearly tapered slot antenna side and the second forward and reverse linearly tapered slot antenna side, a thickness St=0.127 mm of a middle layer of the PCB, a thickness Mt=0.018 mm between an upper metal layer and a lower metal layer of the PCB, a traverse width Rb=0.83 mm of a rectangular metal connector, a slot height Ct=0.163 mm of a metal mode converter, and a slot depth Cl=2.70 mm of the metal mode converter.

Figure 9:
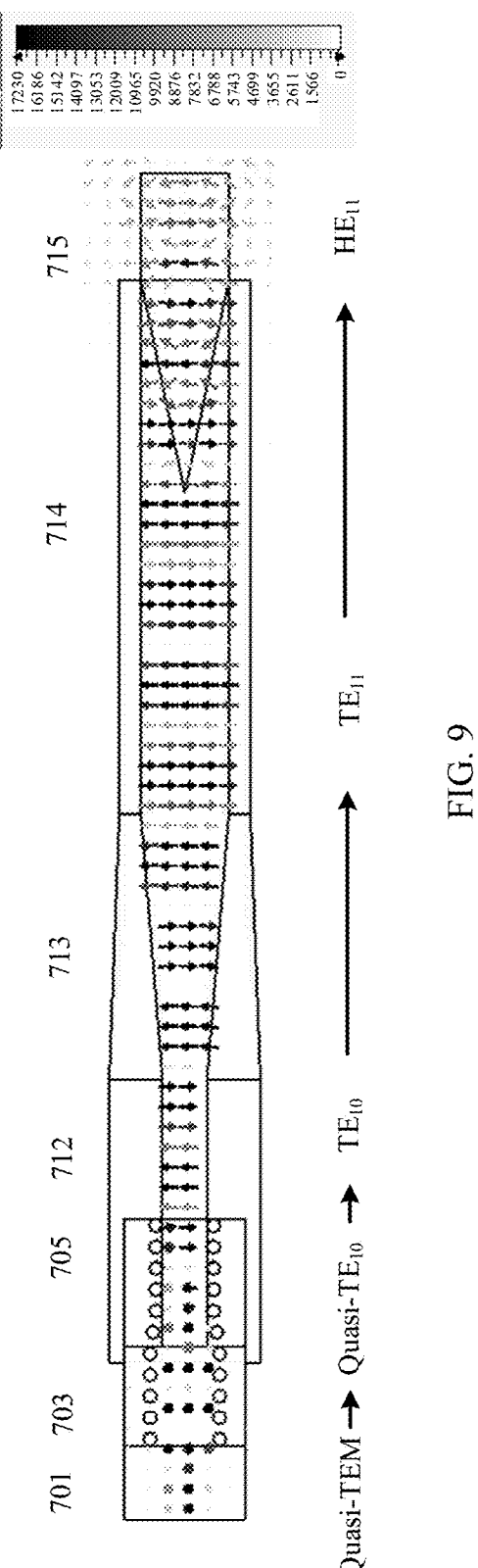
FIG. 9 is a schematic diagram of electric field mode distribution of another electromagnetic simulation according to an embodiment of the present disclosure.

According to the foregoing related dimensions, a schematic diagram of electric field mode distribution shown in FIG. 9 may be obtained through electromagnetic simulation calculation. An electromagnetic signal is connected from the microstrip on the PCB to the on-chip substrate integrated waveguide, to convert from a quasi-TEM mode to a quasi-TE10 mode. Then, the electromagnetic signal feeds, through the substrate integrated waveguide on the PCB, the forward and reverse linearly tapered slot mode excitation structure comprising both a first forward and reverse linearly tapered slot mode excitation structure side and a second forward and reverse linearly tapered slot mode excitation structure side that are arranged with metal through holes, to excite a transmission fundamental mode TE10 mode in the rectangular metal mode conversion structure through the forward and reverse linearly tapered slot mode excitation structure on the PCB. Then, an electromagnetic wave is coupled into the circular waveguide through the square-circular conversion mode conversion structure, to convert into a TE11 mode. Then, the solid core terahertz transmission line with a tapered end face is inserted into the other end of the cylindrical waveguide, to implement fundamental mode transmission of an HE11 mode. From the electric field mode distribution, it may be learned that efficient mode field conversion of the electromagnetic signal from the radio frequency transceiver chip to the terahertz transmission line may be implemented by using the mode conversion structure on the PCB. The gradient color scale in FIG. 9 represents the electric-field strength measured in volts per meter (V/m). The darkest color on the top corresponds to the highest electric-field intensity, around 17230 V/m. The lightest color on the bottom corresponds to the lowest intensity, approaching 0 V/m.

Figure 10:
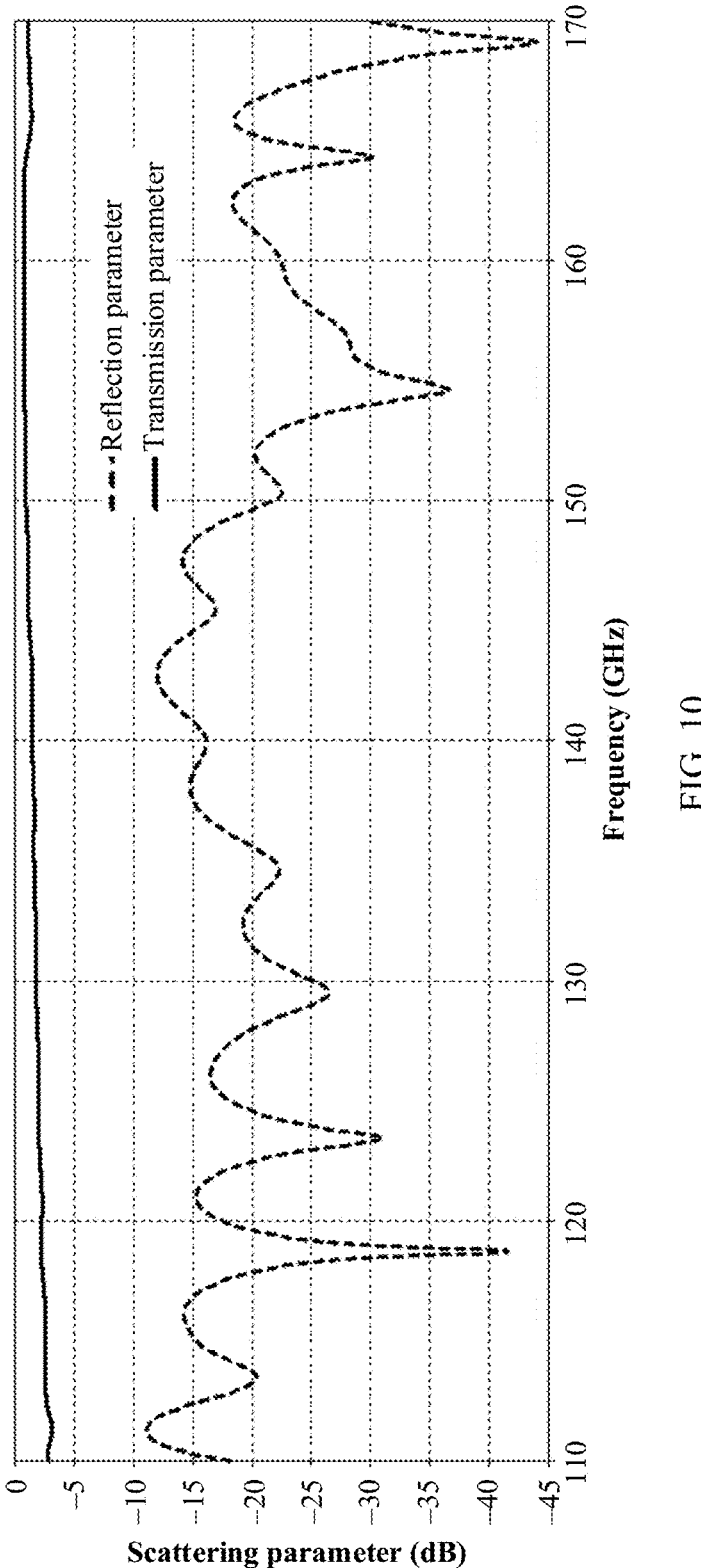
FIG. 10 is a schematic diagram of a transmission parameter of another electromagnetic simulation according to an embodiment of the present disclosure.

As shown in the graph in FIG. 10, where the x-axis of the graph represents the frequency in GHz and the y-axis of the graph represents scattering parameters in dB, through electromagnetic simulation, it may be further learned that a transmission parameter from the microstrip on the PCB to the solid core terahertz transmission line is greater than −2.4 dB in a frequency range of 120 GHz to 160 GHz, and a reflection parameter is less than −12 dB. This indicates that coupling efficiency is high in a very wide frequency band from the radio frequency transceiver chip to the terahertz transmission line. This helps improve a transmission distance and a communication rate of a system.

Figure 11:
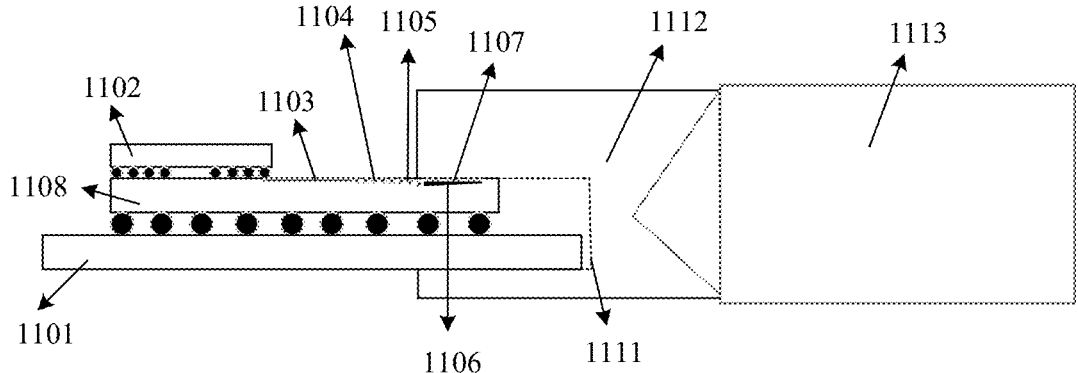
FIG. 11 is a side view of another terahertz carrier transceiver apparatus according to an embodiment of the present disclosure.

FIG. 11 is a side view of a terahertz carrier transceiver apparatus according to an embodiment of the present disclosure. A coupling apparatus with an end-fire function is designed on a package substrate 1108 of a chip 1102. In this way, an electromagnetic signal does not need to pass through a package substrate layer of the chip and a solder ball pin on a PCB 1101, and the electromagnetic signal is directly coupled from a chip signal to a solid core dielectric transmission line on the package substrate.

The radio frequency sending chip 1102 feeds a carrier signal into a uniform substrate integrated waveguide 1104 through a feed microstrip 1103 with a tapered structure, and is further connected to a tapered substrate integrated waveguide 1105, to better match impedance of a mode excitation structure 1106. An eccentric position at one end of the mode conversion structure 1112 is provided with a rectangular positioning slot 1111, and the other end of the mode conversion structure 1112 is inserted into a terahertz transmission line 1113. The PCB 1101 and the package substrate 1108 are inserted into the positioning slot 1111, so that a carrier signal sent by an end-fire antenna may be coupled to the terahertz transmission line 1113 that is inserted into an inner cavity. Metal through holes 1107 are arranged on both a first side and a second side of the substrate integrated waveguide 1104/1105 and the mode excitation structure 1106. A specific design and a constraint condition are similar to those described above.

Figure 12:
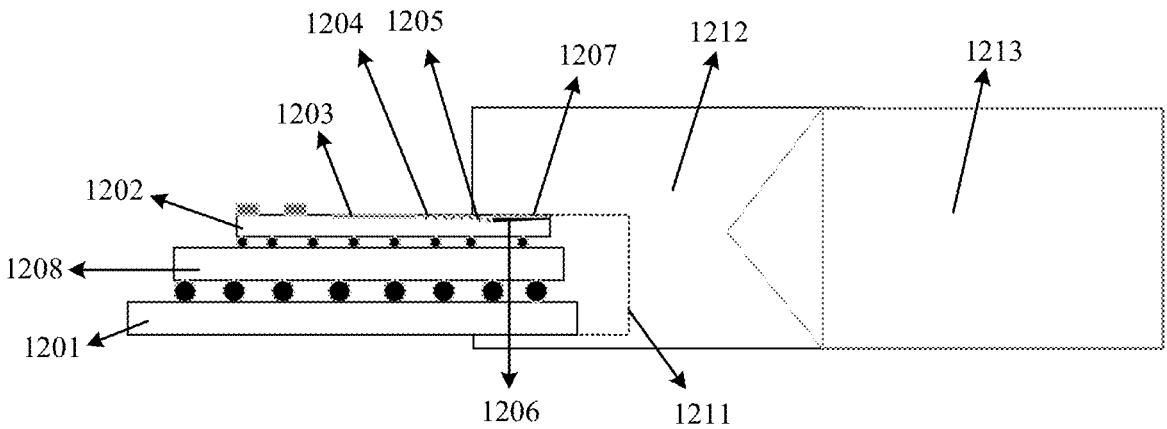
FIG. 12 is a side view of another terahertz carrier transceiver apparatus according to an embodiment of the present disclosure.

FIG. 12 is a side view of another terahertz carrier transceiver apparatus according to an embodiment of the present disclosure. A coupling apparatus with an end-fire function is designed on a radio frequency transceiver chip 1202. In this way, an electromagnetic signal does not need to pass through a package substrate layer of the chip and a solder ball pin on a PCB. The electromagnetic signal is directly coupled from the chip to a metal mode conversion structure and then to a solid core dielectric transmission line without passing through a structure between a radio frequency transceiver chip and a package substrate.

The radio frequency transceiver chip 1202 feeds a carrier signal into a uniform substrate integrated waveguide 1204 through a feed microstrip 1203 with a tapered structure, and is further connected to a tapered substrate integrated waveguide 1205, to better match impedance of a mode excitation structure 1206. An eccentric position at one end of the mode conversion structure 1212 is provided with a rectangular positioning slot 1211, and the other end of the mode conversion structure 1212 is inserted into a terahertz transmission line 1213. The PCB 1201, the package substrate 1208, and the radio frequency transceiver chip 1202 are inserted into the positioning slot 1211 together, so that a carrier signal sent by an end-fire antenna may be coupled to the terahertz transmission line 1213 that is inserted into an inner cavity of the mode conversion structure 1212. Metal through holes 1207 are arranged on both a first side and a second side of the substrate integrated waveguide 1204/1205 and the mode excitation structure 1206. A specific design and a constraint condition are similar to those described above.

In embodiments shown in FIG. 11 and FIG. 12, coupling efficiency is high in a very wide frequency band from the radio frequency transceiver chip to the terahertz transmission line. This helps improve a transmission distance and a communication rate of a system.

Although the present disclosure is described with reference to embodiments, in a process of implementing the present disclosure that claims protection, persons skilled in the art may understand and implement another variation of the disclosed embodiments by viewing the accompanying drawings, disclosed content, and the accompanying claims. In the claims, "comprising" does not exclude another component or another step, and "a" or "one" does not exclude a case of multiple.

Although the present disclosure is described with reference to specific features and embodiments thereof, apparently, various modifications and combinations may be made to the present disclosure. Correspondingly, the specification and accompanying drawings are merely example descriptions of the present disclosure defined by the appended claims, and is considered as any of or all modifications, variations, combinations or equivalents that cover the scope of the present disclosure. It is clear that a person skilled in the art may make various modifications and variations to the present disclosure without departing from the scope of the present disclosure. The present disclosure is intended to cover these modifications and variations provided that they fall within the scope of protection defined by the following claims and their equivalent technologies.

What is claimed is:

1. A terahertz carrier sending apparatus comprising:
a mode conversion structure comprising:
    a positioning slot comprising a boundary that is metal; and
    an inner cavity having a metal inner wall;
a feed transmission line configured to:
    receive an electrical signal from a radio frequency sending circuit; and
    transmit the electrical signal;
a mode excitation structure located in the inner cavity, wherein the mode excitation structure comprises a first mode excitation structure side and a second mode excitation structure side, and wherein the mode excitation structure is configured to:
    receive the electrical signal from the feed transmission line; and
    excite a terahertz signal based on the electrical signal to obtain an excited terahertz signal;
a terahertz transmission line located in the inner cavity and configured to:
    receive the excited terahertz signal; and
    transmit the excited terahertz signal;
a first plurality of metal through-holes distributed on both the first mode excitation structure side and the second mode excitation structure side;
a circuit board, wherein the feed transmission line and the mode excitation structure are fasten to the circuit board; and
a radio frequency sending chip comprising an impedance matching structure configured to match impedance between the feed transmission line and the mode excitation structure,
wherein the positioning slot is configured to insert a part of the circuit board and the mode excitation structure into the inner cavity, and
wherein the boundary is pressed on the first plurality of metal through-holes.

2. The terahertz carrier sending apparatus of claim 1, wherein the feed transmission line, the mode excitation structure, and the first plurality of metal through-holes are located on the circuit board.

3. The terahertz carrier sending apparatus of claim 1, wherein the feed transmission line, the mode excitation structure, and the first plurality of metal through-holes are located on a package substrate of the radio frequency sending chip, and wherein a metal through-hole part on the package substrate and a corresponding part of the circuit board are pressed by the boundary of the positioning slot.

4. The terahertz carrier sending apparatus of claim 1, wherein the feed transmission line, the mode excitation structure, and the first plurality of metal through-holes are located on the radio frequency sending chip, and wherein a metal through-hole part on the radio frequency sending chip and a corresponding part of the circuit board are pressed by the boundary of the positioning slot.

5. The terahertz carrier sending apparatus of claim 1, wherein a radiation phase center of the mode excitation structure coincides with an axial direction of the mode conversion structure.

6. The terahertz carrier sending apparatus of claim 1, wherein the impedance matching structure comprises a first impedance matching structure side and a second impedance matching structure side, and wherein the terahertz carrier sending apparatus further comprises a second plurality of metal through-holes distributed on both the first impedance matching structure side and the second impedance matching structure side.

7. The terahertz carrier sending apparatus of claim 1, wherein the impedance matching structure comprises a uniform substrate integrated waveguide and a tapered substrate integrated waveguide, wherein the tapered substrate integrated waveguide comprises a first tapered substrate integrated waveguide side and a second tapered substrate integrated waveguide side, wherein the first tapered substrate integrated waveguide side and the second tapered substrate integrated waveguide side comprises a second plurality of metal through-holes, and wherein distances between metal through-holes of the second plurality of metal through-holes are correspondingly tapered.

8. A terahertz carrier receiving apparatus comprising:
a mode conversion structure comprising:
    a positioning slot comprising a boundary that is metal; and
    an inner cavity having a metal inner wall;
a terahertz transmission line configured to receive a terahertz signal;
a mode excitation structure comprising a first mode excitation structure side, a second mode excitation structure side, and a first plurality of metal through-holes distributed on both the first mode excitation structure side and the second mode excitation structure side, wherein the mode excitation structure is configured to convert the terahertz signal into an electrical signal;
a feed transmission line configured to:
    receive an electrical signal from the mode excitation structure; and
    transmit the electrical signal to a radio frequency receiving circuit;
a circuit board, wherein the feed transmission line and the mode excitation structure are fasten to the circuit board,
wherein the mode excitation structure and one end of the terahertz transmission line are located in the inner cavity, so that the terahertz signal in the terahertz transmission line is coupled into the mode excitation structure; and
a radio frequency receiving chip comprising an impedance matching structure configured to match impedance between the feed transmission line and the mode excitation structure,
wherein the positioning slot is configured to insert a part of the circuit board and the mode excitation structure into the inner cavity, and
wherein the boundary is pressed on the first plurality of metal through-holes.

9. The terahertz carrier receiving apparatus of claim 8, wherein a radiation phase center of the mode excitation structure coincides with an axial direction of the mode conversion structure.

10. The terahertz carrier receiving apparatus of claim 8, wherein the feed transmission line, the mode excitation structure, and the first plurality of metal through-holes are located on the circuit board.

11. The terahertz carrier receiving apparatus of claim 8, wherein the feed transmission line, the mode excitation structure, the first plurality of metal through-holes are located on a package substrate of the radio frequency receiving chip, and wherein a metal through hole part on the package substrate and a corresponding part of the circuit board are pressed by the boundary of the positioning slot.

12. The terahertz carrier receiving apparatus of claim 8, wherein the feed transmission line, the mode excitation structure, and the first plurality of metal through-holes are located on the radio frequency receiving chip, and wherein a metal through hole part on the radio frequency receiving chip and a corresponding part of the circuit board are pressed by the boundary of the positioning slot.

13. The terahertz carrier receiving apparatus of claim 8, wherein the impedance matching structure comprises a uniform substrate integrated waveguide and a tapered substrate integrated waveguide, wherein the tapered substrate integrated waveguide comprises a first tapered substrate integrated waveguide side and a second tapered substrate integrated waveguide side, wherein the first tapered substrate integrated waveguide side and the second tapered substrate integrated waveguide side comprises a second plurality of metal through-holes, and wherein distances between metal through-holes of the second plurality of metal through-holes are correspondingly change.

14. The terahertz carrier receiving apparatus of claim 8, wherein a second plurality of metal through-holes are distributed on both sides of the impedance matching structure.

15. A terahertz carrier sending apparatus comprising:
a mode conversion structure comprising:
    a positioning slot comprising a boundary that is metal; and
    an inner cavity having a metal inner wall;
a feed transmission line configured to:
    receive an electrical signal from a radio frequency sending circuit; and
    transmit the electrical signal;
a mode excitation structure located in the inner cavity, wherein the mode excitation structure comprises a first mode excitation structure side and a second mode excitation structure side, and wherein the mode excitation structure is configured to:
    receive the electrical signal from the feed transmission line; and
    excite a terahertz signal based on the electrical signal to obtain an excited terahertz signal;

a first plurality of metal through-holes distributed on both sides of the first mode excitation structure side and the second mode excitation structure side;
a circuit board, wherein the feed transmission line and the mode excitation structure are fasten to the circuit board; and
a radio frequency sending chip comprising an impedance matching structure configured to match impedance between the feed transmission line and the mode excitation structure,
wherein the positioning slot is configured to insert a part of the circuit board and the mode excitation structure into the inner cavity, and
wherein the boundary is pressed on the first plurality of metal through-holes.

16. The terahertz carrier sending apparatus of claim 15, wherein the impedance matching structure comprises a uniform substrate integrated waveguide and a tapered substrate integrated waveguide, wherein the tapered substrate integrated waveguide comprises a first tapered substrate integrated waveguide side and a second tapered substrate integrated waveguide side, wherein the first tapered substrate integrated waveguide side and the second tapered substrate integrated waveguide side comprises a second plurality of metal through-holes, and wherein distances between metal through-holes of the second plurality of metal through-holes are correspondingly tapered.

17. The terahertz carrier sending apparatus of claim 15, wherein the feed transmission line, the mode excitation structure, and the first plurality of metal through-holes are located on the radio frequency sending chip.

18. The terahertz carrier sending apparatus of claim 15, further comprising a terahertz transmission line located in the inner cavity and configured to:
    receive the excited terahertz signal; and
    transmit the excited terahertz signal.

19. The terahertz carrier sending apparatus of claim 15, wherein the feed transmission line, the mode excitation structure, and the first plurality of metal through-holes are located on a package substrate of the radio frequency sending chip.

20. The terahertz carrier sending apparatus of claim 15, wherein the feed transmission line, the mode excitation structure, and the first plurality of metal through-holes are located on the circuit board.

* * * * *